US011128826B2

(12) United States Patent
Lenhard

(10) Patent No.: US 11,128,826 B2
(45) Date of Patent: Sep. 21, 2021

(54) SENSOR ARRANGEMENT TO SENSE AN EXTERNAL SIGNAL

(71) Applicant: ams AG, Premstaetten (AT)

(72) Inventor: Herbert Lenhard, Premstaetten (AT)

(73) Assignee: AMS AG, Premstaetten (AT)

( * ) Notice: Subject to any disclaimer, the term of this patent is extended or adjusted under 35 U.S.C. 154(b) by 0 days.

(21) Appl. No.: 16/761,875

(22) PCT Filed: Nov. 13, 2018

(86) PCT No.: PCT/EP2018/081039
§ 371 (c)(1),
(2) Date: May 6, 2020

(87) PCT Pub. No.: WO2019/096771
PCT Pub. Date: May 23, 2019

(65) Prior Publication Data
US 2021/0218393 A1     Jul. 15, 2021

(30) Foreign Application Priority Data

Nov. 15, 2017   (EP) ..................................... 17201931

(51) Int. Cl.
*H03K 17/16*         (2006.01)
*H04N 5/369*         (2011.01)
(Continued)

(52) U.S. Cl.
CPC .............. *H04N 5/369* (2013.01); *H02M 1/08* (2013.01); *H03K 17/162* (2013.01); *H03K 17/693* (2013.01)

(58) Field of Classification Search
CPC ....... H02M 1/08; H03K 17/16; H03K 17/162; H04N 5/369
(Continued)

(56) References Cited

U.S. PATENT DOCUMENTS 4,839,735 A * 6/1989 Kyomasu .......... H01L 27/14603
                                                  257/290
5,705,807 A * 1/1998 Throngnumchai ... G01J 1/4228
                                                  250/214 B
(Continued)

FOREIGN PATENT DOCUMENTS

GB        2308684        7/1997

OTHER PUBLICATIONS

European Patent Office, International Search report for PCT/EP2018/081039 dated Mar. 20, 2019.
(Continued)

*Primary Examiner* — William Hernandez
(74) *Attorney, Agent, or Firm* — MH2 Technology Law Group LLP

(57) ABSTRACT

A sensor arrangement to sense an external signal comprises a sensor (100) and a charge generator (200) to generate a compensation current (Ic) to compensate the sensor current. A charge generator (200) comprises a first transistor (210) having a parasitic capacitor (212) and a first conductive path. The charge generator (200) comprises a second transistor (220) having a second conductive path being coupled in series to the first transistor (210) and coupled to the output node (O200) of the charge generator (200). The control circuit (600) is configured to control the conductivity of the respective first and second conductive path of the first and the second transistor (210, 220) of the charge generator (200) so that the sensor current is compensated by the compensation current (Ic).

15 Claims, 4 Drawing Sheets

(51) Int. Cl.
*H02M 1/08* (2006.01)
*H03K 17/693* (2006.01)

(58) Field of Classification Search
USPC .................................. 250/206; 327/509, 514
See application file for complete search history.

(56) References Cited

U.S. PATENT DOCUMENTS

| | | | | |
|---|---|---|---|---|
| 5,835,121 | A * | 11/1998 | Genovese | H04N 1/4005 347/246 |
| 9,148,602 | B2 * | 9/2015 | Ha | H04N 5/378 |
| 2008/0224186 | A1 * | 9/2008 | Ellis-Monaghan | H04N 5/37452 257/292 |
| 2013/0112848 | A1 * | 5/2013 | Lin | H04N 5/369 250/206 |
| 2013/0277539 | A1 * | 10/2013 | Smilansky | H04N 5/359 250/208.1 |
| 2014/0103411 | A1 * | 4/2014 | Dai | H01L 27/14643 257/292 |
| 2017/0251151 | A1 * | 8/2017 | Hicks | H01L 27/14625 |
| 2019/0229138 | A1 * | 7/2019 | Lee | H01L 27/14616 |

OTHER PUBLICATIONS

Behzad Razavi: "Introduction to Switched-Capacitor Circuits", Sep. 3, 2013 XP055392576, Retrieved from the Internet: URL:https://web.archive.org/web/20130903011127if_/http://www.seas.ucla.edu:80/brweb/ teaching/AIC Ch12.pdf [retrieved on Jul. 20, 2017] paragraph 12.2.4 Charge Injection Cancellation; p. 411-p. 413.

Roubik Gregorian et al: "Nonideal Effects in Switched-Capacitor Circuits; Nonideal Effects in the Switches" In: "Analog CMOS Integrated Circuits for Signal Processing", Dec. 31, 1986 (Dec. 31, 1986), Wiley, XP055470461, ISBN: 978-0-471-62569-8 pp. 462-474, p. 469-p. 470.

* cited by examiner

SENSOR ARRANGEMENT TO SENSE AN EXTERNAL SIGNAL

TECHNICAL FIELD

The disclosure relates to a sensor arrangement to sense an external signal, wherein a charge is provided for a sensor interface to a sensor.

BACKGROUND

A sensor arrangement may comprise a charge generator to generate a compensation charge/compensation current in a sensor interface. The charge generator generates the compensation charge/compensation current for example to compensate a sensor charge generated by a sensor, for example a photodiode, in a charge balance circuit topology. The charge generator can be designed with an SC (switched capacitor) circuit. The SC circuit may comprise a controllable switch to couple a capacitor to a reference voltage to load the capacitor in a first operation cycle and to discharge the capacitor in a second operation cycle. The compensation charge/compensation current is provided by discharging the capacitor. The capacitor is configured as a charge storage element to store the compensation charge.

A well-known problem in a conventional SC topology of the charge generator is the lower limit of the compensation charge generated owed to charge injection by switches coupling directly to charge storage elements. Each time a switching state of a controllable switch of the charge generator is changed, a disturbing charge is generated. The disturbing charges may change the desired compensation charge which is necessary to compensate the sensor charge. The lower the compensation charge, the stronger the unwanted influence of the disturbing charge portions of switching elements of the charge generator in a sensor interface.

There is a desire to provide a sensor arrangement to sense an external signal, which allows to reduce the unwanted influence of disturbing charges caused by switching elements to a compensation charge to compensate a sensor charge of a sensor of the sensor arrangement.

SUMMARY

A sensor arrangement to sense an external signal is specified in claim 1.

According to an embodiment, the sensor arrangement to sense an external signal comprises a sensor to provide a sensor charge/sensor current in dependence from the external signal. The sensor arrangement further comprises a charge generator to generate a compensation charge/compensation current to compensate the sensor charge/sensor current. The sensor arrangement further comprises an output node of the charge generator to provide the compensation charge/compensation current. The sensor is coupled to the output node of the charge generator to provide the sensor charge/sensor current of the sensor at the output node of the charge generator.

The sensor arrangement comprises a reference voltage line to provide a reference voltage. The sensor arrangement further comprises a control circuit to control the generation of the compensation charge/compensation current. The charge generator comprises a first transistor having a parasitic capacitor and a first conductive path. The first transistor is connected to the reference voltage line. The charge generator comprises a second transistor having a second conductive path being coupled in series to the first transistor and coupled to the output node of the charge generator. The control circuit is configured to control the conductivity of the respective conductive path of the first and the second transistor of the charge generator so that the sensor charge/sensor current is compensated by the compensation charge/compensation current. "Compensation" means that the sensor current is equal or almost equal to the compensation current.

In order to circumvent the limitation regarding the lower limit of the compensation charge, the charge generator of the sensor arrangement uses the charge injection caused by the switching operation of the transistors of the charge generator itself to generate the compensation charge. In particular, the parasitic capacitor of the first transistor of the charge generator is used as a storage element to store a respective compensation charge portion during subsequent switching cycles of the first and the second transistor.

This means that the charge generator of the sensor arrangement does not use a device/capacitor provided especially for charge storing purposes. The sensor arrangement rather uses the parasitic capacitor of the first transistor to store a packet of charge that is to be transferred to the output node of the charge generator.

The first and the second transistor of the charge generator are alternately switched between a conductive and non-conductive state. During a first operation state of the charge generator, the first transistor is operated in a conductive state so that the reference voltage line is conductively connected to the parasitic capacitor, and the parasitic capacitor is charged by the reference voltage. The second transistor is operated in the non-conductive state during the first operation state of the charge generator. During a subsequent second operation state of the charge generator, the first transistor is operated in the non-conductive state and the second transistor is operated in the conductive state so that the charge packet stored at the parasitic capacitor is discharged and transferred to the output node.

The switching of the second transistor between the conductive and non-conductive state causes the generation of a disturbing charge that influences the desired compensation charge/compensation current. In order to compensate the disturbing charge caused by the switching operations of the second transistor, the charge generator may comprise a compensation component. The compensation component is used to compensate a charge component generated by a parasitic capacitance of the second transistor. In particular, the compensation component is configured to compensate the AC-charge component generated by the gate-source capacitance of the second transistor of the charge generator. The compensation component may be configured as a transistor with drain and source terminals connected to each other so that a capacitor is realized.

The electrical properties of the first and second transistor and/or the compensation component of the charge generator depend on external parameters, for example the temperature or manufacturing tolerances. In order to compensate temperature effects and process variations an additional reference loop/controllable reference voltage generator can be provided. The controllable reference voltage generator is configured to generate the reference voltage on the reference voltage line to control the amount of injected charge at the output node of the charge generator.

The controllable reference voltage generator comprises a charge monitor circuit to provide a monitor current to an output node of the charge monitor circuit. The controllable reference voltage generator further comprises a constant current source, for example a bandgap reference, which applies a reference current to the output node of the charge monitor circuit. The constant current source generates the reference current as a constant current.

The controllable reference voltage generator/reference loop further comprises a loop controller being arranged between the output node of the charge monitor circuit and the reference voltage line. The loop controller changes the reference voltage on the reference voltage line in dependence on a comparison of the monitor charge/monitor current of the charge monitor circuit and the reference current of the constant current source.

The controllable reference voltage generator is configured to adjust the reference voltage at the reference voltage line so that the monitor current equals the reference current at the output node of the charge monitor circuit. As a consequence of this, the compensation charge/compensation current generated by the charge generator will also be well-defined by the reference current of the constant current source. In conclusion, the charge injected from the parasitic capacitor of the first transistor of the charge generator in dependence on the charging state of the parasitic capacitor is used as a compensation charge to compensate the sensor charge/sensor current, but in a well-controlled manner by using the reference loop/controllable reference voltage generator.

The charge generator of the sensor arrangement provides a compensation charge generation by using controllable switches/transistors only. The amount of the compensation charge/compensation current is defined by a reference loop/controllable reference voltage generator. In particular, the reference loop/controllable reference voltage generator stabilizes the compensation charge/compensation current against temperature drift, process variations and supply changes. The proposed sensor arrangement with compensation charge generation may be used for sensor interfaces to optical as well as non-optical sensors, in particular to those sensors which generate an output signal configured as an output current.

Additional features and advantages are set forth in the detailed description that follows, and in part will be readily apparent to those skilled in the art from the description or recognized by practicing the embodiments as described in the written description and claims hereof, as well as the appended drawings. It is to be understood that both the foregoing general description and the following detailed description are merely exemplary, and are intended to provide an overview or framework to understand the nature and character of the claims.

DETAILED DESCRIPTION

Figure 1:
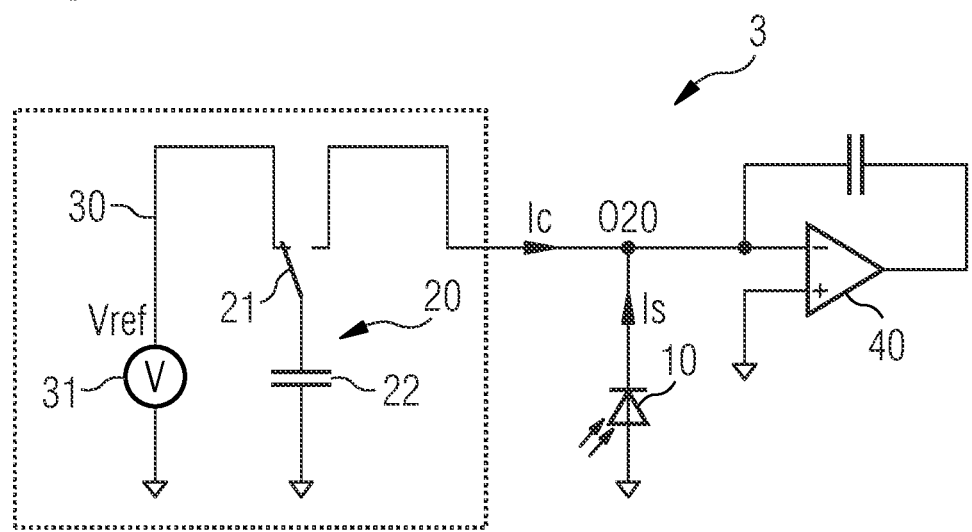
FIG. 1 shows a conventional topology of a sensor arrangement comprising a charge generator to generate a compensation charge/compensation current to compensate a sensor charge/sensor current.

Embodiments of a sensor arrangement to sense an external signal with a compensation charge generation for the sensor interface and its components are now be described more fully hereinafter with reference to the accompanying drawings. The embodiments of the sensor arrangement and its components may, however, be embodied in many different forms and should not be construed as limited to the embodiments set forth herein; rather, these embodiments are provided so that the disclosure will fully convey the scope of the embodiments of the sensor arrangement and its components to those skilled in the art. The drawing are configured to clearly illustrate the different embodiments of the sensor arrangement and its components.

FIG. 1 shows a conventional embodiment of a sensor arrangement 3 to sense an external signal, for example a light signal. The light signal impacts on a sensor 10, for example a photodiode. A sensor charge/sensor current Is is generated by the sensor 10 in dependence from the intensity of the impacting light.

The sensor arrangement 3 further comprises a charge generator 20 being configured to generate a compensation charge/compensation current Ic at an output node O20 of the charge generator 20. The conventional sensor arrangement 3 comprises a reference voltage source 31 to provide a reference voltage Vref on a reference voltage line 30.

The charge generator 20 comprises a controllable switch 21 and a capacitor 22. The capacitor 22 is charged during a first operation state of the controllable switch 21 which is illustrated in FIG. 1. The capacitor 22 is conductively connected to the reference voltage Vref during the first operation state. The capacitor 22 is charged by the reference voltage Vref. After having charged the capacitor 22, the switching state of the controllable switch 21 is changed so that the capacitor 22 is connected to the output node O20 of the charge generator 20.

The switching state of the controllable switch 21 is alternately changed so that the capacitor 22 is charged and discharged, and a compensation charge/compensation current Ic is generated by the charge generator 20 at the output node O20 of the charge generator 20. The purpose of the charge generator 20 is to provide the compensation charge/compensation current Ic at the output node O20 of the charge generator 20 such that the sensor charge/sensor current Is is compensated.

The output node O20 of the charge generator 20 is connected to an integrator 40. The switching sequence to switch the controllable switch 21 between the first operation state in which the capacitor 22 is coupled to the reference voltage Vref, and a second state in which the capacitor 22 is coupled to the output node O20, is controlled such that an output signal of the integrator circuit 40 is kept at a zero level. In this case the compensation charge/compensation current Ic would compensate the sensor charge/sensor current Is of the sensor 10. The number of changes of the switching state of the controllable switch 21 is a measure for the intensity of the incident light.

According to the conventional topology for the charge generator 20 shown in FIG. 1, an SC (Switched Capacitor) implementation for the charge generator is most widely used in combination with a reference voltage. However, due to the permanently occurring switching cycles of the controllable switch 21, disturbing charges are generated and injected to the output node O20 in addition to the desired compensation charge stored at the capacitor 22. The disturbing charges are stored in parasitic capacitors of the controllable switch 21. The controllable switch 21 may be realized by transistors so that the parasitic capacitors of the transistors are charged/discharged during the switching cycles and distort the desired compensation charge at the output node O20. The disturbing charges are indeed relevant when a weak light intensity impacts the photodiode 10 and the sensor current Is is small and the desired compensation charge stored at the capacitor 22 is small as well.

Figure 2:
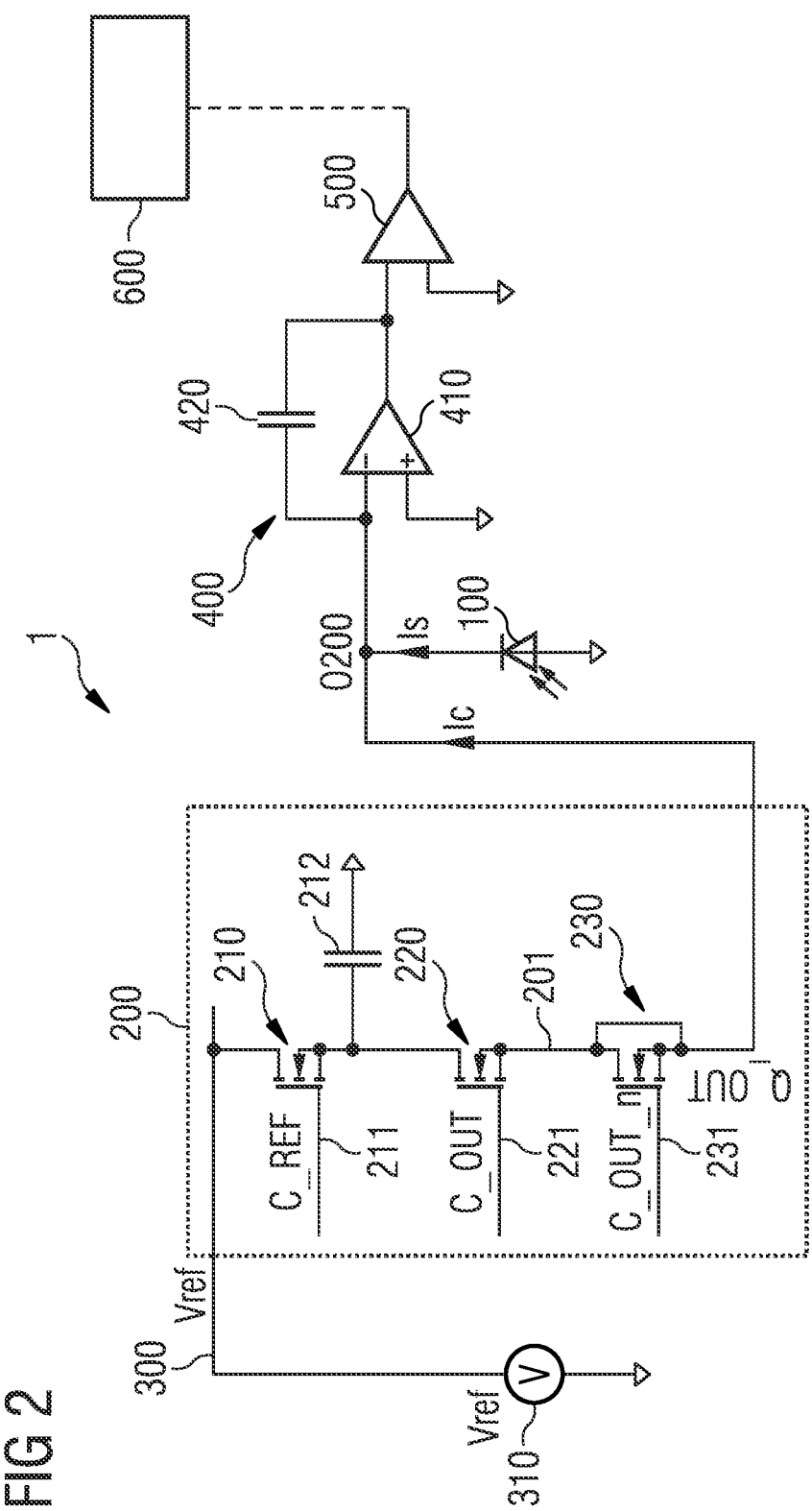
FIG. 2 shows an embodiment of sensor arrangement comprising a charge generator to generate a compensation charge/compensation current to compensate a sensor charge/sensor current of a sensor of the sensor arrangement by using charge storage elements being configured as a parasitic capacitor of a transistor of a charge generator.

FIG. 2 shows an embodiment of a sensor arrangement 1 to sense an external signal, wherein the sensor arrangement comprises an improved charge generator 200 in comparison to the charge generator 20 shown in FIG. 1. In particular, the improved charge generator omits the generation of disturbing charges during subsequent switching cycles of the transistors of the charge generator.

The sensor arrangement 1 comprises a sensor 100 to provide a sensor charge/sensor current Is in dependence on an external signal which is captured by the sensor. According to the exemplified embodiment shown in FIG. 2, the sensor 100 is configured as a photodiode to generate the sensor charge/sensor current Is in dependence from external light impacting the photodiode 100.

The sensor arrangement 1 further comprises the charge generator 200 to generate a compensation charge/compensation current Ic at an output node O200 of the charge generator 200 to compensate the sensor charge/sensor current Is of the sensor. The sensor 100 is coupled to the output node O200 of the charge generator 200. The sensor arrangement 1 further comprises a reference voltage line 300 to provide a reference voltage Vref which is used by the charge generator 200 to generate the compensation charge/compensation current Ic.

The output node O200 of the charge generator 200 is connected to an integrator circuit 400. An output side of the integrator circuit 400 is connected to a comparator 500. The integrator circuit 400 generates an output signal at its output side in dependence on the charge/current applied by the sensor 100 at the output node O200 and the compensation charge/compensation current Ic generated at the output node O200 by the charge generator 200. The comparator 500 generates an evaluation signal at its output side in dependence from the output signal of the integrator circuit 400. The evaluation signal of the comparator 500 is evaluated by a control circuit 600 to control the generation of the compensation charge/compensation current Ic.

The charge generator 200 comprises at least a current branch 201. The first current branch 201 comprises a first transistor 210 having a parasitic capacitor 212 and a first conductive path. The first transistor 210 of the charge generator 200 is connected to the reference voltage line 300. The charge generator 200 further comprises a second transistor 220 being arranged in the current branch 201 having a second conductive path being coupled in series to the first transistor 210 and coupled to the output node O200 of the charge generator 200. The parasitic capacitor 212 is shown in FIG. 2 with the first side being coupled between a source node of the first transistor 210 and a drain node of the second transistor 220, and having a second side being coupled to a reference potential.

The first and the second transistor 210, 220 of the charge generator 200 are controlled by the control circuit 600 to be operated in a conductive and non-conductive state. The conductivity of the first transistor 210 is controlled by the control signal C_REF applied at a control terminal 211 of the first transistor 210. The conductivity of the second transistor 220 is controlled by a control signal C_OUT applied at a control terminal 221 of the second transistor 220. The control signals C_REF and C_OUT are generated by the control circuit 600.

The charge generator 200 is operated in a first and a second operation state. The control circuit 600 is configured to control the first transistor 210 of the charge generator 200 in a conductive state and to control the second transistor 220 of the charge generator 200 in a non-conductive state to load the parasitic capacitor 212 by conductively coupling the parasitic capacitor 212 to the reference voltage line 300 during the first operation state. The control circuit 600 is further configured to control the first transistor 210 of the charge generator 200 in a non-conductive state and to control the second transistor 220 of the charge generator 200 in a conductive state to provide the compensation charge/compensation current Ic at the output node O200 of the charge generator 200 during the second operation state.

The control circuit 600 is configured to control the conductivity of the respective first and second conductive path of the first and second transistor 210, 220 of the charge generator 200 so that the sensor charge/sensor current Is is compensated by the compensation charge/compensation current Ic. The compensation current Ic is generated by subsequent packets of the compensation charge that are transferred to the output node O200 of the charge generator by alternately charging and discharging the parasitic capacitor 212 during the switching cycles of the first and the second transistor 210 and 220.

The charge generator 200 in its basic concept shown in FIG. 2 is built up by the two transistors 210 and 220. The combination of the controllable switches 210 and 220 with the reference voltage Vref and the parasitic capacitor 212 may be considered as a capacitive DC-DC converter or charge-pump.

When the second transistor 220 is switched from the non-conductive state during the first operation state into the conductive state during the second operation state, a disturbing charge is injected in the output node O200 of the charge generator. The disturbing charge is an AC-charge component generated by the gate-source capacitance of the second transistor 220.

In order to compensate this disturbing charge, the charge generator 200 may comprise a compensation component 230. The compensation component 230 is arranged in the current branch 201 between the second transistor 220 and the output node O200 of the charge generator 200. The compensation component 230 is configured to compensate the AC-charge component generated by the gate-source capacitance of the second transistor 220 of the charge generator 200.

In particular, the compensation component 230 may be configured as a transistor having a drain and source node which are connected to each other. Since the source and the drain terminal of the transistor 230 are connected to each other, the transistor 230 just has the function of a capacitor which is effective against the capacitor of the second transistor 220. The transistor 230 has a control terminal 231 to apply a control signal C_OUT_n being generated by the control circuit 600. The transistor 230 may be used as a matching unit to compensate the AC-charge component generated by the gate-source capacitance of the second transistor 220.

The control circuit 600 generates the control signals C_REF, C_OUT as well as C_OUT_n so that the charge generator 200 generates the compensation charge/compensation current Ic at the output node O200 of the charge generator 200 so that the output signal of the integrator circuit 400 has a zero level. In this case, the charge generator 200 generates the compensation charge/compensation current Ic exactly with a level to compensate the sensor charge/sensor current Is. When compared to the conventional charge generator 20 shown in FIG. 1, the combination of the controllable switch 21 and the capacitor 22 which is configured as a concrete device according to the standard topology of FIG. 2, is replaced by the string of transistors 210, 220 and 230. The function of the capacitor 22 is resumed by the parasitic capacitor 212 of the first transistor 210.

Figure 3:
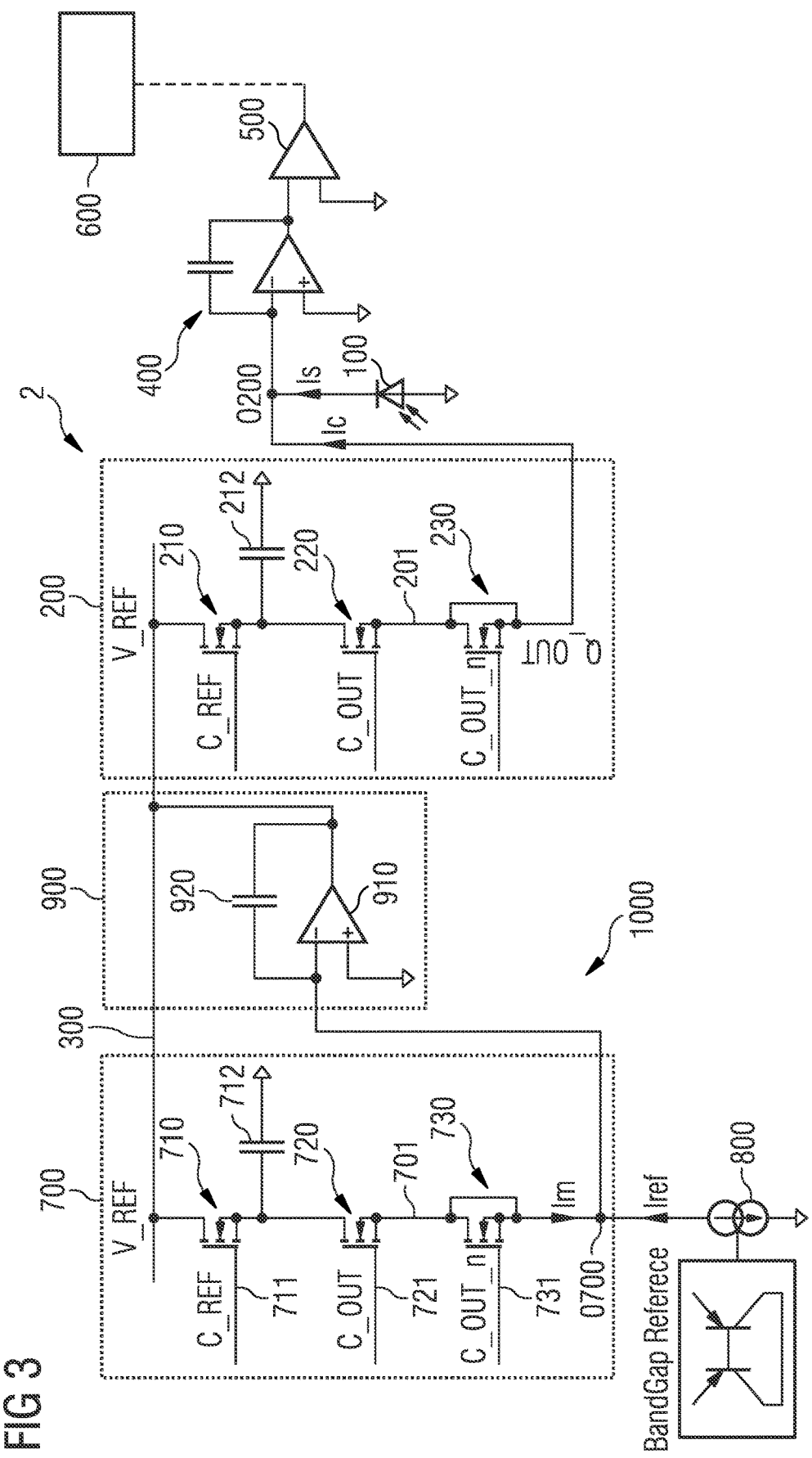
FIG. 3 shows an embodiment of a sensor arrangement comprising a reference loop/controllable reference voltage generator to generate a reference voltage on a reference voltage line of the sensor arrangement and a charge generator.

The electrical properties of the transistors 210, 220 and 230 depend on temperature effects and process variations. FIG. 3 shows an improved embodiment of the sensor arrangement 2 shown in FIG. 2. According to the embodiment of the sensor arrangement 3 of FIG. 3, temperature effects and process variations are compensated by the utilization of a controllable reference voltage generator/reference loop/control loop 1000 in order to control the amount of injected charge provided by the charge generator 200. In particular, the controllable reference voltage generator 1000 is configured to generate/adjust the reference voltage Vref on the reference voltage line 300.

The controllable reference voltage generator 1000 comprises a charge monitor circuit 700 having at least a current branch 701 and an output node O700. The current branch 701 is coupled between the reference voltage line 300 and the output node O700 of the charge monitor circuit 700. The charge monitor circuit 700 is configured to provide a monitor current Im to the output node O700 of the charge monitor circuit 700.

The controllable reference voltage generator 1000 comprises a constant current source 800 to generate a reference current Iref. The constant current source may be configured as a bandgap reference.

According to the embodiment of the sensor arrangement 3 shown in FIG. 3, the charge monitor circuit 700 comprises a first transistor 710 and a second transistor 720 being arranged in the current branch 701. The first transistor 710 of the charge monitor circuit 700 has a parasitic capacitor 712 and a first conductive path. The first transistor 710 of the charge monitor circuit 700 is connected to the reference voltage line 300. The second transistor 720 of the charge monitor circuit 700 has a second conductive path being coupled in series to the first transistor 710 of the charge monitor circuit 700 and coupled to the output node O700 of the charge monitor circuit 700.

The first and the second transistor 710 and 720 of the charge monitor circuit 700 are controlled by the control circuit 600 to be operated in a conductive and non-conductive state. The first transistor 710 has a control terminal 711 to apply a control signal CM_REF being generated by the control circuit 600. The second transistor 720 comprises a control terminal 721 to apply a control signal CM_OUT generated by the control circuit 600.

The charge monitor circuit 700 is operated in a first and a second operation state. The control circuit 600 is configured to control the first transistor 710 of the charge monitor circuit 700 in a conductive state and to control the second transistor 720 of the charge monitor circuit 700 in a non-conductive state to load the parasitic capacitor 712 by conductively coupling the parasitic capacitor 712 to the reference voltage line 300 during the first operation state of the charge monitor circuit. The control circuit 600 is further configured to control the first transistor 710 of the charge monitor circuit 700 in a non-conductive state and to control the second transistor 720 of the charge monitor circuit 700 in a conductive state to provide the monitor current Im at the output node O700 of the charge monitor circuit 700 during the second operation state of the charge monitor circuit 700.

The parasitic capacitor 712 of the first transistor 710 is charged by the reference voltage Vref during the first operation state and discharged to the output node O700 during the second operation state. The monitor current Im is generated by subsequent packets of the charge stored on the parasitic capacitor 712 during the first operation state of the charge monitor circuit and discharged during the second operation state of the charge monitor circuit.

When changing its switching state between the conductive and non-conductive state, the second transistor 720 generates a disturbing charge at the output node O700 which influences the monitor current Im. The disturbing charge is an AC charge component generated by the gate-source capacitance of the second transistor 720. The charge monitor circuit 700 comprises a compensation component 730 to compensate the disturbing charge generated by the second transistor 720 of the charge monitor circuit 700, when the second transistor 720 of the charge monitor circuit 700 is switched between the conductive and non-conductive state.

The compensation component 730 of the charge monitor circuit 700 is configured to compensate the AC-charge component generated by the gate-source capacitance of the second transistor 720 of the charge monitor circuit 700. The compensation component 730 may be configured as a transistor having a control terminal 731 which is controlled by a control signal CM_OUT_n. The control signal CM_OUT_n is generated by the control circuit 600. The transistor 730 may have a drain and a source terminal which are connected together, as shown in FIG. 3. The compensation component 730 thus realizes a capacitor which is effective against the gate-source capacitance of the transistor 720.

The controllable reference voltage generator 1000 comprises a loop controller 900 being arranged between the output node O700 of the charge monitor circuit 700 and the reference voltage line 300. The loop controller 900 is configured to generate an output voltage at the reference voltage line 300 in dependence on a comparison of the monitor current Im and the reference current Iref. The loop controller 900 may be configured as an integrator circuit.

According to the embodiment of the sensor arrangement 3, the reference voltage Vref is generated by a control loop realized by the controllable reference voltage generator 1000, which generates the monitor charge/monitor current Im at a constant frequency controlled by the control signals CM_REF, CM_OUT, CM_OUT_n. The monitor current Im is compared with a constant reference current Iref derived from the constant current source/bandgap reference. The comparison of the monitor current Im and the reference current Iref is performed by the loop controller 900.

The controllable reference voltage generator 1000 is configured to generate the reference voltage Vref on the reference voltage line 300 in dependence on the monitor current Im of the charge monitor circuit 700 and the reference current Iref of the constant current source 800. The controllable reference voltage generator 1000 is configured to generate an amount of the monitor current Im at the output node O700 of the charge monitor circuit 700 so that the reference current Iref of the constant current source 800 is compensated by the monitor current Im.

The result of the comparison of the monitor charge/monitor current Im with the reference current Iref is used to adjust the reference voltage Vref at the reference voltage line 300 so that the monitor charge per time, i.e. the monitor current Im, is equal to the reference current Iref. This means that the charge monitor circuit 700 generates exactly the monitor current Im being equal to the reference current Iref. As a consequence of this, the compensation charge/compensation current Ic at the output node O200 is well-defined by the reference current Iref of the constant current source 800.

The sensor arrangement 3 shown in FIG. 3 enables to compensate temperature effects and process variations, because the charge generator 200 and the charge monitor circuit 700 comprise the same components, i.e. the transistors 210/710, 220/720 and 230/730.

Figure 4:
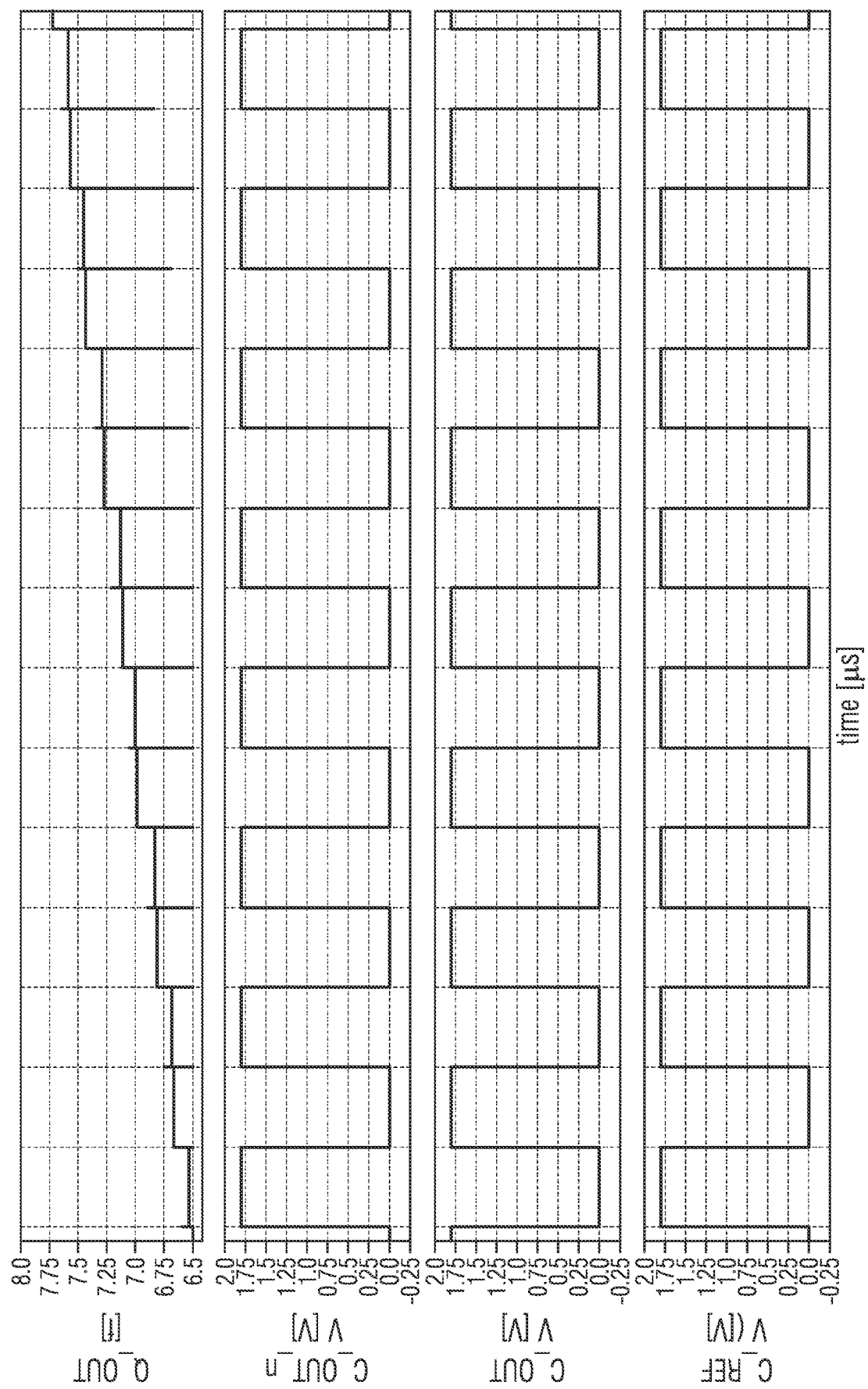
FIG. 4 illustrates control signals to control transistors of the charge generator of the sensor arrangement.

FIG. 4 shows control signals C_REF, C_OUT and C_OUT_n generated by the control circuit 600 to control the transistors 210, 220 and 230 of the charge generator 200. The control signals C_REF and C_OUT are non-overlapping clock signals. The control signal C_OUT_n represents the inversion of the control signal C_OUT. The first diagram of FIG. 4 illustrates the increase of the compensation charge Q OUT provided by the charge generator 200 at the output node O200. As shown in FIG. 4, each clock period generates a certain amount of compensation charge into the output node O200 of the charge generator 200. This compensation charge is controllable by the reference voltage Vref.

In conclusion, as compared to the conventional topology of a sensor arrangement shown in FIG. 1, according to the embodiments 1 and 2 of the sensor arrangement, the limiting parasitic effect of charge injection of the conventional SC implementation of a charge generator is used in the proposed sensor arrangement as the exclusive effect for charge generation. Temperature effects and process variations are compensated by providing an additional reference loop/controllable reference voltage generator in order to control the amount of injected charge.

LIST OF REFERENCE SIGNS 1 first embodiment of sensor arrangement
2 second embodiment of sensor arrangement
3 conventional embodiment of sensor arrangement
10 sensor/photodiode
20 charge generator
21 controllable switch
22 capacitor
30 reference voltage line
31 reference voltage source
40 integrator
100 sensor/photodiode
200 charge generator
210 first transistor
212 parasitic capacitor
220 second transistor
230 compensation device
300 reference voltage line
310 reference voltage source
400 integrator
500 comparator
600 control circuit
700 charge monitor circuit
710 first transistor of charge monitor circuit
720 second transistor of charge monitor circuit
730 compensation device of charge monitor circuit
800 constant current source
900 integrator
1000 reference loop/controllable reference voltage generator

The invention claimed is:

1. A sensor arrangement to sense an external signal, comprising:
a sensor to provide a sensor current in dependence from the external signal,
a charge generator to generate a compensation current to compensate the sensor current,
an output node of the charge generator to provide the compensation current, wherein the sensor is coupled to the output node of the charge generator to provide the sensor current of the sensor at the output node of the charge generator,
a reference voltage line to provide a reference voltage,
a control circuit to control the generation of the compensation current,
wherein the charge generator comprises a first transistor having a parasitic capacitor and a first conductive path, the first transistor being connected to the reference voltage line,
wherein the charge generator comprises a second transistor having a second conductive path being coupled in series to the first transistor and coupled to the output node of the charge generator,
wherein the parasitic capacitor of the first transistor is exclusively used as a storage element to store a compensation charge portion for generating the compensation current, and
wherein the control circuit is configured to control the conductivity of the respective first and second conductive path of the first and the second transistor of the charge generator so that the sensor current is compensated by the compensation current.

2. The sensor arrangement of claim 1,
wherein the first and the second transistor of the charge generator are controlled by the control circuit to be operated in a conductive and non-conductive state.

3. The sensor arrangement of claim 2,
wherein the charge generator is operated in a first and a second operation state,
wherein the control circuit is configured to control the first transistor of the charge generator in a conductive state and to control the second transistor of the charge generator in a non-conductive state to load the parasitic capacitor by conductively coupling the parasitic capacitor to the reference voltage line during the first operation state,
wherein the control circuit is configured to control the first transistor of the charge generator in a non-conductive state and to control the second transistor of the charge generator in a conductive state to provide the compensation current at the output node of the charge generator during the second operation state.

4. The sensor arrangement of claim 2,
wherein the charge generator comprises a compensation component to compensate a disturbing charge generated by the second transistor of the charge generator, when the second transistor of the charge generator is switched between the conductive and non-conductive state.

5. The sensor arrangement of claim 4,
wherein the compensation component of the charge generator is configured to compensate an AC-charge component generated by a gate-source capacitance of the second transistor of the charge generator.

6. The sensor arrangement of claim 4, comprising:
a controllable reference voltage generator to generate the reference voltage on the reference voltage line.

7. The sensor arrangement of claim 6,
wherein the charge generator comprises at least a first current branch, the first current branch including the first transistor and the second transistor and the compensation component of the charge generator,
wherein the controllable reference voltage generator comprises a charge monitor circuit having at least a second current branch and an output node, the second current branch being coupled between the reference voltage line and the output node of the charge monitor circuit,
wherein the charge monitor circuit is configured to provide a monitor current to the output node of the charge monitor circuit.

8. The sensor arrangement of claim 7,
wherein the controllable reference voltage generator comprises a constant current source to generate a reference current,
wherein the controllable reference voltage generator is configured to generate the reference voltage in dependence on the monitor current of the charge monitor circuit and the reference current of the constant current source.

9. The sensor arrangement of claim 8,
wherein the controllable reference voltage generator is configured to generate an amount of the monitor current at the output node of the charge monitor circuit so that the reference current of the constant current source is compensated by the monitor current.

10. The sensor arrangement of claim 7,
wherein the charge monitor circuit comprises a first transistor and a second transistor,
wherein the first transistor of the charge monitor circuit has a parasitic capacitor and a first conductive path, the first transistor of the charge monitor circuit is connected to the reference voltage line,
wherein the second transistor of the charge monitor circuit has a second conductive path being coupled in series to the first transistor of the charge monitor circuit and coupled to the output node of the charge monitor circuit.

11. The sensor arrangement of claim 10,
wherein the first and the second transistor of the charge monitor circuit are controlled by the control circuit to be operated in a conductive and non-conductive state.

12. The sensor arrangement of claim 10,
wherein the charge monitor circuit is operated in a first and a second operation state,
wherein the control circuit is configured to control the first transistor of the charge monitor circuit in a conductive state and to control the second transistor of the charge monitor circuit in a non-conductive state to load the parasitic capacitor by conductively coupling the parasitic capacitor to the reference voltage line during the first operation state of the charge monitor circuit,
wherein the control circuit is configured to control the first transistor of the charge monitor circuit in a non-conductive state and to control the second transistor of the charge monitor circuit in a conductive state to provide the monitor current at the output node of the charge monitor circuit during the second operation state of the charge monitor circuit.

13. The sensor arrangement of claim 10,
wherein the charge monitor circuit comprises a compensation component to compensate a disturbing charge generated by the second transistor of the charge monitor circuit, when the second transistor of the charge monitor circuit is switched between the conductive and non-conductive state.

14. The sensor arrangement of claim 7,
wherein the controllable reference voltage generator comprises a loop controller being arranged between the output node of the charge monitor circuit and the reference voltage line,
wherein the loop controller is configured to generate an output voltage at the reference voltage line in dependence on a comparison of the monitor current and the reference current.

15. The sensor arrangement of claim 14,
wherein the loop controller is configured as an integrator circuit.

* * * * *